(12) United States Patent
Asenov et al.

(10) Patent No.: US 11,894,049 B1
(45) Date of Patent: Feb. 6, 2024

(54) CFET SRAM CELL UTILIZING 8 TRANSISTORS

(71) Applicant: Synopsys, Inc., Mountain View, CA (US)

(72) Inventors: Plamen Asenov, Glasgow (GB); Victor Moroz, Saratoga, CA (US)

(73) Assignee: Synopsys, Inc., Mountain View, CA (US)

( * ) Notice: Subject to any disclaimer, the term of this patent is extended or adjusted under 35 U.S.C. 154(b) by 165 days.

(21) Appl. No.: 17/540,903

(22) Filed: Dec. 2, 2021

Related U.S. Application Data

(60) Provisional application No. 63/121,712, filed on Dec. 4, 2020.

(51) Int. Cl.
  G11C 11/412 (2006.01)
  G11C 11/419 (2006.01)
  H10B 10/00 (2023.01)

(52) U.S. Cl.
  CPC .......... G11C 11/412 (2013.01); G11C 11/419 (2013.01); H10B 10/125 (2023.02)

(58) Field of Classification Search
  CPC .... G11C 11/412; G11C 11/419; H10B 10/125
  USPC ........................................................ 365/154
  See application file for complete search history.

(56) References Cited

U.S. PATENT DOCUMENTS

| 2021/0098051 A1* | 4/2021 | Pao | G11C 11/419 |
| 2021/0201998 A1* | 7/2021 | Yuh | G11C 14/0081 |
| 2022/0108742 A1* | 4/2022 | Li | G11C 11/54 |

FOREIGN PATENT DOCUMENTS

| KR | 20070016965 | * 7/2006 | |
| WO | WO-2020255801 A1 | * 12/2020 | H01L 27/1108 |

OTHER PUBLICATIONS

Moroz et al., "DTCO Launches Moore's Law Over the Feature Scaling Wall," 2020 IEEE International Electron Devices Meeting (IEDM), San Francisco, CA, USA, Dec. 12-18, 2020, pp. 41.1.1-41.1.4.

* cited by examiner

*Primary Examiner* — Fernando Hidalgo
(74) *Attorney, Agent, or Firm* — Haynes Beffel & Wolfeld LLP; Andrew L. Dunlap

(57) ABSTRACT

A memory cell comprises a pair of cross-coupled inverters as a storage element, a first inverter in the pair of cross-coupled inverters having a first output at a first node, a second inverter in the pair of cross-coupled inverters having a second output at a second node. A first complementary transmission gate includes a first nMOS pass gate and a first pMOS pass gate, connected between the first node and a first bit line. A second complementary transmission gate includes a second nMOS pass gate and a second pMOS pass gate, connected between the second node and a second bit line. A first word line is connected to gate conductors of the first and second nMOS pass gates in the first and second complementary transmission gates. A second word line is connected to gate conductors of the first and second pMOS pass gates in the first and second transmission gates.

9 Claims, 8 Drawing Sheets

CFET SRAM CELL UTILIZING 8 TRANSISTORS

RELATED APPLICATION

This application claims priority under 35 U.S.C. § 119(e) to U.S. Provisional Patent Application No. 63/121,712, entitled "CFET SRAM CELL UTILIZING 8 TRANSISTORS" filed on Dec. 4, 2020, which application is incorporated herein by reference.

TECHNICAL FIELD

The present technology relates to memory cell architectures, more specifically to SRAM architectures.

BACKGROUND

SRAM (static random access memory) is a key component of modern digital circuits and systems, as such it is important to achieve maximum density, performance and yield for this cell type.

Therefore, a need arises for better SRAM cell configurations that can be used to improve writability, readability and/or stability. It would be ideal if such improvements can be had at low or no extra area cost.

SUMMARY

The present technology provides a memory cell suited for SRAM (static random access memory) applications that can be implemented using a complementary field effect transistor (CFET) technology. Methods for reading and writing to CFET SRAM memory cells are also provided. Implementations can achieve improvements in writability, readability and/or stability.

In an aspect of the present technology a memory cell comprises a pair of cross-coupled inverters as a storage element, a first inverter in the pair of cross-coupled inverters having a first output at a first node, a second inverter in the pair of cross-coupled inverters having a second output at a second node. A first complementary transmission gate includes a first nMOS pass gate and a first pMOS pass gate, connected between the first node and a first bit line. A second complementary transmission gate includes a second nMOS pass gate and a second pMOS pass gate, connected between the second node and a second bit line. A first word line is connected to gate conductors of the first and second nMOS pass gates in the first and second complementary transmission gates. A second word line is connected to gate conductors of the first and second pMOS pass gates in the first and second complementary transmission gates.

In another aspect of the present technology, the pair of cross-coupled inverters, the first complementary transmission gate, and the second complementary transmission gate can be implemented within a single CFET cell.

In a further aspect of the present technology, the CFET cell can comprise a multilayer stacked structure, including a first metal layer, in which the first word line is disposed, a first transistor layer, a second transistor layer, and a second metal layer, in which the second word line is disposed.

In another aspect of the present technology, the first transistor layer can include the first nMOS pass gate of the first complementary transmission gate, the second nMOS pass gate of the second complementary transmission gate, a first nMOS pull down transistor of a first one of the pair of cross-coupled inverters, and a second nMOS pull down transistor of a second one of the pair of cross-coupled inverters.

In a further aspect of the present technology, the first pMOS pass gate can be disposed in the second transistor layer beneath the first nMOS pass gate disposed in the first transistor layer, and the second pMOS pass gate can be disposed in the second transistor layer beneath the second nMOS pass gate disposed in the first transistor layer.

In another aspect of the present technology, the CFET cell further comprises a third metal layer, in which a set of complementary bit lines, and a power line VSS are disposed. In some implementations, this third metal layer will be situated above the first metal layer. In other implementations, this third metal layer will be located at different positions within the structure.

In a further aspect of the present technology, the second layer can comprise a buried power rail (BPR).

In another aspect of the present technology, a method of writing to the memory cell includes triggering the first and second word lines at the a same time.

In another aspect of the present technology, a method of writing to the memory cell includes further includes allowing triggering each of the first and second complementary transmission gates to write values to each of the pair of cross-coupled inverters in a single write operation.

In another aspect of the present technology, a method of writing to the memory cell includes, writing a '0' on the first node QL and a '1' on the second node QR during a single writing operation.

In another aspect of the present technology, a method of reading from the memory cell includes triggering the second word line. Then, according to the method, waiting until a bump voltage at the first node drops. The method also includes triggering the first word line after the bump voltage at the first node drops.

In a further aspect of the present technology, the method of reading from the memory cell further includes synchronizing the first and second word lines WL and WWL to achieve a preferred read current. By initiating read of a weaker cell employing word line underdrive as a stability assist, whereby the first and second word lines WL are swept up to an operating voltage less than Vdd, allowing the bump voltage to discharge.

BRIEF DESCRIPTION OF THE DRAWINGS

The present technology will be understood more fully from the detailed description given below and from the accompanying figures of embodiments thereof. The figures are used to provide knowledge and understanding of embodiments of the present technology and do not limit the scope of thereof to these specific embodiments. Furthermore, the figures are not necessarily drawn to scale.

DETAILED DESCRIPTION

Aspects of the present technology relate to a CFET SRAM cell utilizing 8 transistors (8T). CFET (complementary field effect transistor) is a promising new technology to enable higher transistor density and lower cost per function for the electronics industry. One unique aspect of a CFET, in comparison to a single transistor stack, is that in an exemplary CFET cell, an equal number of transistors are typically fabricated. In a particular configuration, however, although 4 nMOS transistors and 2 pMOS transistors are used in for example a 6T CFET SRAM cell, 2 pMOS "parasitic" or unused transistors are also fabricated.

The present technology provides in embodiments an 8T CFET SRAM cell that uses the 2 pMOS "parasitic" or unused transistors in configurations that can provide improvements in writability, readability and/or stability. Some 8T CFET SRAM implementations provide these benefits at little to no extra area cost. The 2 now used pMOS transistors convert 2 nMOS pass gates into 2 complementary transmission gates. Implementations can achieve: 1) improvements in writability; 2) improvements in readability while maintaining stability; and 3) flip the polarity of the bit line pre-charge from '1' to '0', which can prove beneficial when the pMOS pass gate is stronger than the nMOS pass gate. The present technology can provide reduced need for assist schemes requiring greater amounts of area, when compared to conventional SRAM architectures.

Figure 1:
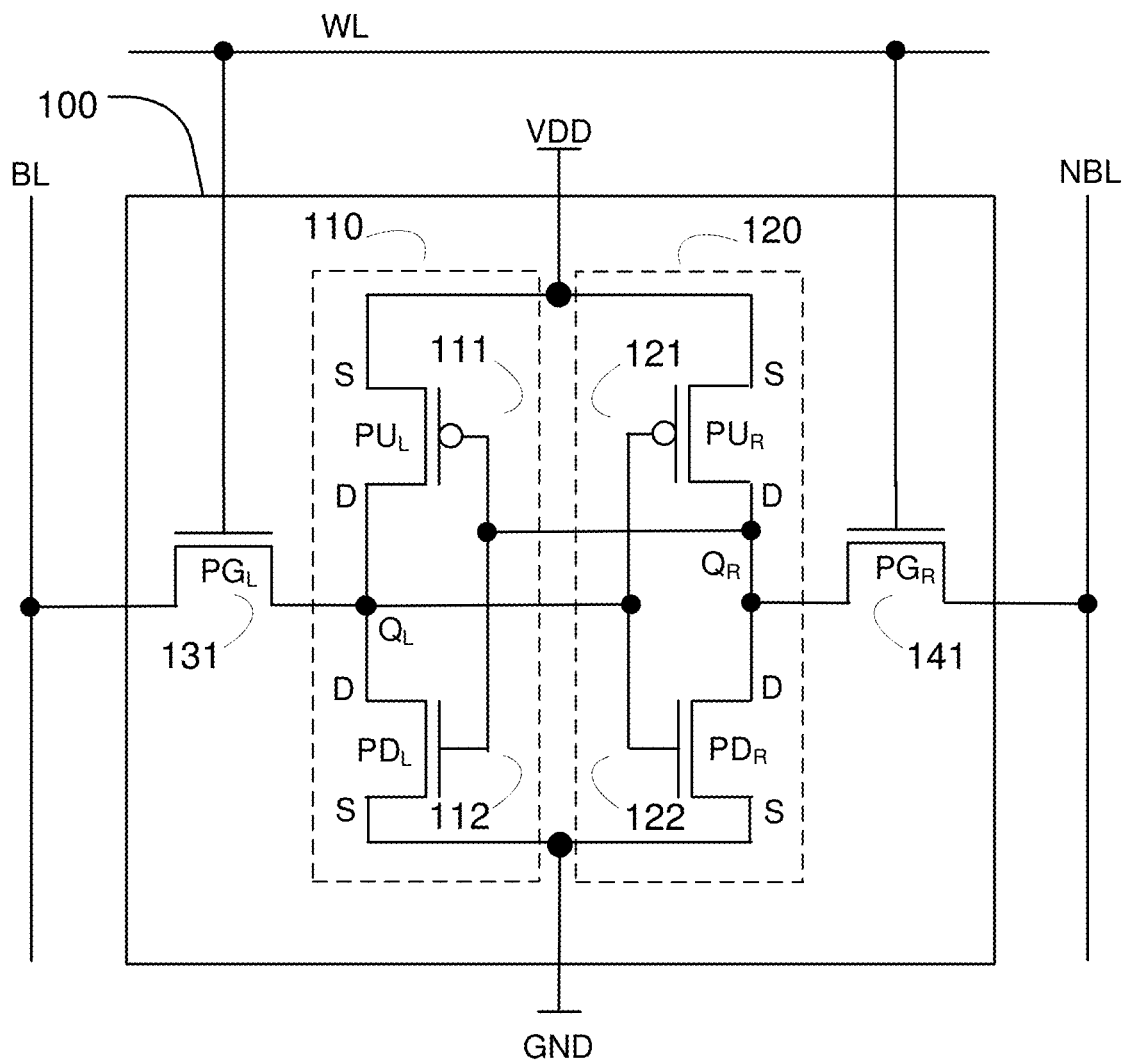
FIG. 1 illustrates an example transistor level schematic for a 6T SRAM cell.

FIG. 1 illustrates an example transistor level schematic for a 6T SRAM cell. A 6T SRAM cell as referred to in the present specification is a memory cell that does not need to be periodically refreshed to retain stored data.

As illustrated in the example of FIG. 1, a 6T SRAM cell 100 uses a pair of cross-coupled inverters 110, 120 as a storage element. The pair includes a first inverter 110 configured with a pull-down transistor $PD_L$ 112 and a pull-up transistor $PU_L$ 111, and a second inverter 120 configured with a pull-down transistor $PD_R$ 122 and a pull-up transistor $PU_R$ 121. The first inverter 110 has a first output at a first node $Q_L$, which is connected to a gate conductor of the second inverter 120, at which an input signal to the second inverter can be applied. The second inverter 120 has a second output at a second node $Q_R$, which is connected to a gate conductor of the first inverter (e.g., 110), at which an input signal to the first inverter can be applied.

The 6T SRAM cell includes a first pass gate $PG_L$ 131, and a second pass gate $PG_R$ 141. The first and second pass gates act as access devices to provide a switchable data path for data into and out of the 6T SRAM cell. A word line (WL) is connected to gate conductors the first and second pass gates. The word line WL controls the 6T SRAM cell for reading or writing. Complementary bit lines BL and NBL provide the data path to the first and second pass gates.

Sources (S) of the pull-up transistors $PU_L$ 111 and $PU_R$ 121 are connected to the 6T SRAM cell supply voltage (e.g., VDD), while sources (S) of the pull-down transistors $PD_L$ 112 and $PD_R$ 122 are connected to the 6T SRAM cell ground voltage (e.g., GND). Drains (D) of the pull-up transistor $PU_L$ 111 and pull-down transistor $PD_L$ 112 are connected together and to the first node $Q_L$ of the first inverter 110. The first pass gate $PG_L$ 131 is connected between the first node $Q_L$ and the bit line BL. Drains (D) of the pull-up transistor $PU_R$ 121 and pull-down transistor $PD_R$ 122 are connected together and to the second node $Q_R$. The second pass gate $PG_R$ 141 is connected between the second node $Q_R$ and the bit line NBL.

For the simplified description below about the read and write operations of an 6T SRAM cell, it is assumed that a high data value stored in the 6T SRAM cell corresponds to a state when the first node $Q_L$ of the first inverter 110 is at a high data value and the second node $Q_R$ is at a low data value. At the beginning of a read or write operation, the word line WL selects the 6T SRAM cell by turning on the first and second pass gates 131, 141. At the end of the read or write operation, the word line WL deselects the 6T SRAM cell by turning off the first and second pass gates 131, 141.

In a write operation, a voltage corresponding to a low data value is applied to one of the complementary bit lines BL and NBL, while a voltage corresponding to a high data value is applied to another of the complementary bit lines BL and NBL, to change the state of the storage element. For instance, to write a high data value, a voltage corresponding to a high data value is applied to the bit line BL, while a voltage corresponding to a low data value is applied to the bit line NBL. To write a low data value, a voltage corresponding to a low data value is applied to the bit line BL, while a voltage corresponding to a high data value is applied to the bit line NBL.

When a high data value is stored in the 6T SRAM cell, in the first inverter 110, the pull-down transistor $PD_L$ 112 is turned off and the pull-up transistor $PU_L$ 111 is turned on so that the first node $Q_L$ exhibits a high data value while, in the second inverter 120, the pull-down transistor $PD_R$ 122 is turned on and the pull-up transistor $PU_R$ 121 is turned off so that the second node $Q_R$ exhibits a low data value. When a low data value is stored in the 6T SRAM cell, in the first inverter 110, the pull-down transistor $PD_L$ 112 is turned on and the pull-up transistor $PU_L$ 111 is turned off so that the first node $Q_L$ exhibits a low data value while, in the second inverter 120, the pull-down transistor $PD_R$ 122 is turned off and the pull-up transistor $PU_R$ 121 is turned on so that the second node $Q_R$ exhibits a high data value.

In a read operation, a voltage corresponding to a high data value is applied to the bit lines BL and NBL, and the 6T SRAM cell is selected by the word line WL. If a high data value is stored in the 6T SRAM cell, current flows through the second pass gate $PG_R$ 141 and the pull-down transistor $PD_R$ 122 to ground, and through the pull-up transistor $PU_L$ 111 and the first pass gate $PG_L$ 131 to the bit line BL. If a low data value is stored in the 6T SRAM cell, current flows through the pull-down transistor $PD_R$ 122 and the second pass gate $PG_R$ 141 to the bit line NBL, and through the first pass gate $PG_L$ 131 and the pull-down transistor $PD_L$ 112 to ground.

Figure 2:
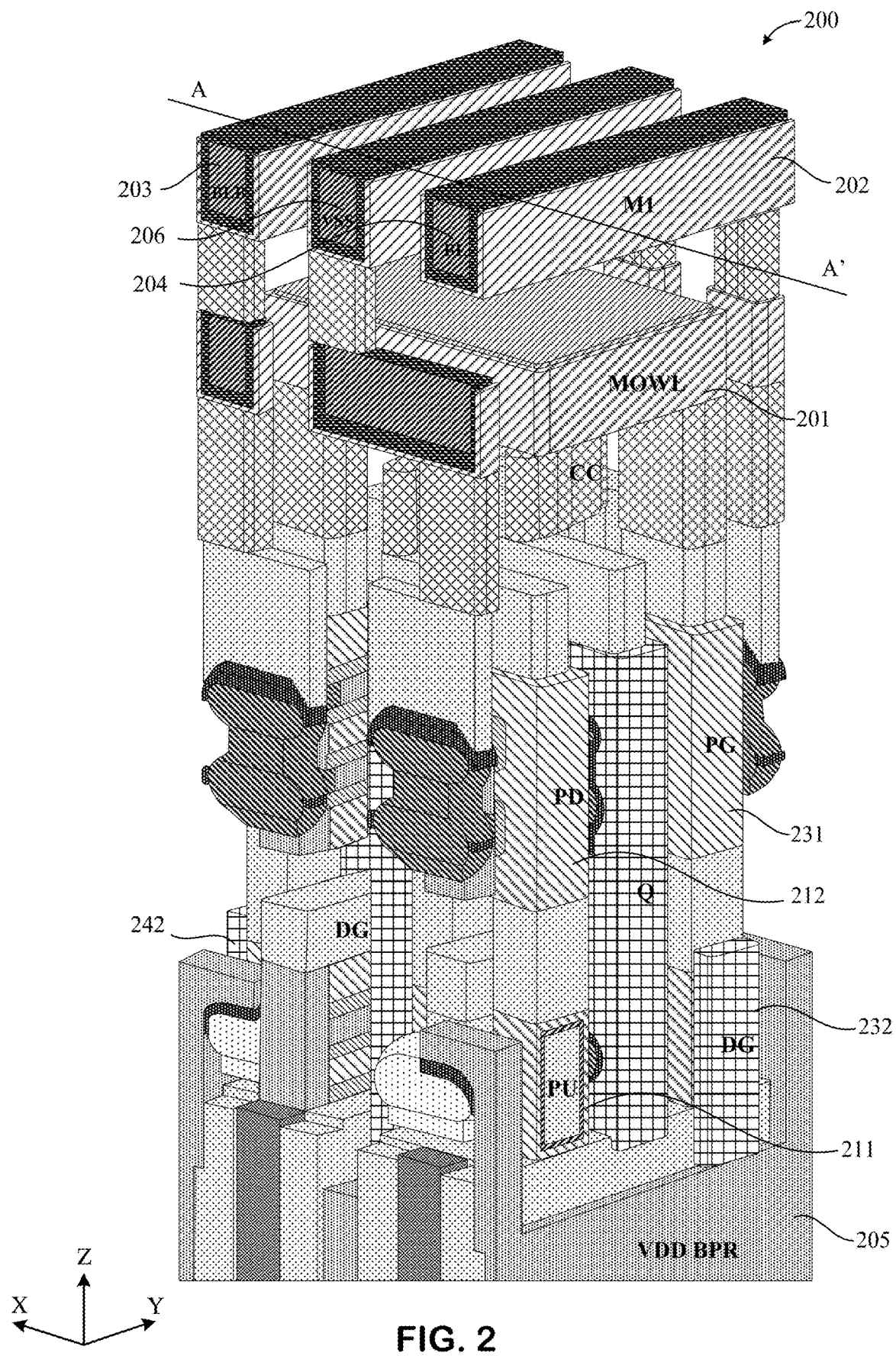
FIG. 2 illustrates an example perspective view of a structure of a CFET cell in which an SRAM can be embodied.

FIG. 2 illustrates an example perspective view of a structure of a CFET cell, in which an SRAM can be embodied. In FIG. 2, a CFET structure 200 includes a first set comprising of a pMOS transistor PU 210, an nMOS transistor PD 211, and an nMOS transistor PG 231 on a first side of the CFET structure as shown. An SRAM cell includes a second set (not shown in FIG. 2) of a pMOS transistor PU, an nMOS transistor PD, and an nMOS transistor PG on a second side of the structure 200 opposite the first side illustrating the first set of PU 210, PD 211 and PG 231. The first set can correspond to one of (a pull-up transistors $PU_L$ 110, a pull-down transistor $PD_L$ 111, and a first pass gate $PG_L$ 131) and (a pull-up transistors $PU_R$ 120, a pull-down transistor PD$_R$ 121, a second pass gate PG$_R$ 141) shown in the example transistor level schematic in FIG. 1. The second set can correspond to another of (a pull-up transistors PU$_L$ 110, a pull-down transistor PD$_L$ 111 and a first pass gate PG$_L$ 131) and (a pull-up transistors PU$_R$ 120, a pull-down transistor PD$_R$ 121, a second pass gate PG$_R$ 141) shown in FIG. 1. A word line WL is disposed at a first metal layer M0 201 and complementary bit lines BL 204 and BLB 203 are disposed at a second metal layer M1 204. A power line VSS 206 is disposed at the second metal layer M1 202, and a VDD BPR 205 (Buried Power Rail) is disposed at the bottom of the structure.

As shown in FIG. 2, the structure of a CFET cell also includes two additional pMOS devices 232, 242 at a same vertical level as a pMOS transistor PU 211, as indicated by dotted circles. In a 6T SRAM configuration, these devices are unused, however in an 8T SRAM implementation described hereinbelow with reference to FIG. 3, these devices are employed. One of these additional pMOS device 232 is disposed below an nMOS transistor PG 231 in the first set of a pMOS transistor PU 211, an nMOS transistor PD 212, and an nMOS transistor PG 231 on the first side of the structure. Another of the additional pMOS devices 242 is disposed below an nMOS transistor PG in the second set (not shown in FIG. 2) of a pMOS transistor PU, an nMOS transistor PD, and an nMOS transistor PG on the second side of the structure.

Figure 3:
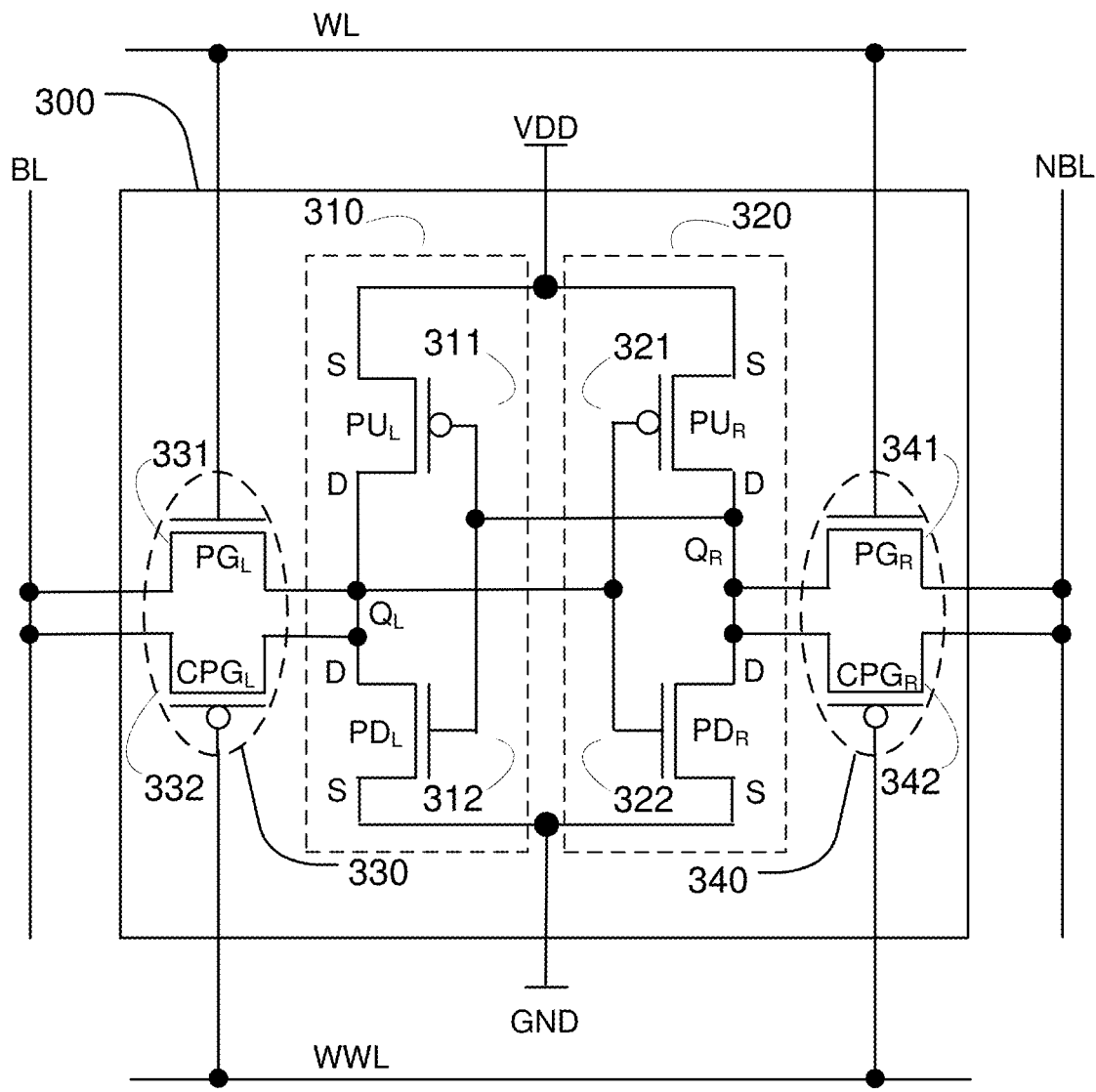
FIG. 3 illustrates an example transistor level schematic for an 8T SRAM cell.

FIG. 3 illustrates a transistor level schematic for an 8T SRAM cell. An 8T SRAM cell as referred to in the present specification is a memory cell that does not need to be periodically refreshed to retain stored data. As illustrated in the example of FIG. 3, a 8T SRAM cell 300 uses a pair of cross-coupled inverters 310, 320 as a storage element. The pair includes a first inverter 310 configured with a pull-down transistor PD$_L$ 312 and a pull-up transistor PU$_L$ 311, and a second inverter 320 configured with a pull-down transistor PD$_R$ 322 and a pull-up transistor PU$_R$ 321. The first inverter 310 has a first output at a first node Q$_L$, which is connected to a gate conductor of the second inverter 320, at which an input signal to the second inverter can be applied. The second inverter 320 has a second output at a second node Q$_R$, which is connected to a gate conductor of the first inverter (e.g., 310), at which an input signal to the first inverter can be applied.

The 8T SRAM cell includes a first complementary transmission gate 330 including a first nMOS pass gate PG$_L$ 331 and a first pMOS pass gate CPG$_L$ 332, and a second complementary transmission gate 340 including a second nMOS pass gate PG$_R$ 341 and a second pMOS pass gate CPG$_R$ 342. The first and second complementary transmission gates 330, 340 act as access devices to provide a switchable data path for data into and out of the 8T SRAM cell. A first word line (WL) is connected to gate conductors of the nMOS pass gates 331, 341 in the first and second complementary transmission gates 330, 340. A second word line (WWL) is connected to gate conductors of the pMOS pass gates 332, 342 in the first and second complementary transmission gates 330, 340. The first and second word lines WL and WWL control the 8T SRAM cell for reading or writing. Complementary bit lines BL and NBL provide the data path to the first and second complementary transmission gates 330, 340.

The first complementary transmission gate 330 is connected between the first node Q$_L$ and the bit line BL. The second complementary transmission gate 340 is connected between the second node Q$_R$ and the bit line NBL.

For the simplified description below about the read and write operations of an 8T SRAM cell, it is assumed that a high data value stored in the 8T SRAM cell corresponds to a state when the first node Q$_L$ of the first inverter 310 is at a high data value and the second node Q$_R$ is at a low data value. At the beginning of a read or write operation, the first word line WL and the second word line WWL select the 8T SRAM cell by turning on the first and second complementary transmission gates 330, 340. At the end of the read or write operation, the first word line WL and the second word line WWL deselect the 8T SRAM cell by turning off the first and second complementary transmission gates 330, 340.

In a write operation, a voltage corresponding to a low data value is applied to one of the complementary bit lines BL and NBL, while a voltage corresponding to a high data value is applied to another of the complementary bit lines BL and NBL, to change the state of the storage element 300. For instance, to write a high data value, a voltage corresponding to a high data value is applied to the bit line BL, while a voltage corresponding to a low data value is applied to the bit line NBL. To write a low data value, a voltage corresponding to a low data value is applied to the bit line BL, while a voltage corresponding to a high data value is applied to the bit line NBL.

When a high data value is stored in the 8T SRAM cell, in the first inverter 310, the pull-down transistor PD$_L$ 312 is turned off and the pull-up transistor PU$_L$ 311 is turned on so that the first node Q$_L$ exhibits a high data value while, in the second inverter 320, the pull-down transistor PD$_R$ 322 is turned on and the pull-up transistor PU$_R$ 321 is turned off so that the second node Q$_R$ exhibits a low data value. When a low data value is stored in the 8T SRAM cell, in the first inverter 310, the pull-down transistor PD$_L$ 312 is turned on and the pull-up transistor PU$_L$ 311 is turned off so that the first node Q$_L$ exhibits a low data value while, in the second inverter 320, the pull-down transistor PD$_R$ 322 is turned off and the pull-up transistor PU$_R$ 321 is turned on so that the second node Q$_R$ exhibits a high data value.

In a read operation, a voltage corresponding to a high data value is pre-charged to the bit lines BL and NBL, which are then left floating, and the 8T SRAM cell is selected by the first and second word lines WL and WWL. If a high data value is stored in the 8T SRAM cell, current flows through the second complementary transmission gate 340 and the pull-down transistor PD$_R$ 322 to ground, and through the pull-up transistor PU$_L$ 311 and the first complementary transmission gate 330 to the bit line BL. If a low data value is stored in the 8T SRAM cell, current flows through the pull-down transistor PD$_R$ 322 and the second complementary transmission gate 340 to the bit line NBL, and through the first complementary transmission gate 330 and the pull-down transistor PD$_L$ 312 to ground.

There is an added benefit to having a complementary transmission gate (330, 340, FIG. 3) including a pMOS pass gate (CPG$_L$ 332, CPG$_R$ 342, FIG. 3) in addition to an nMOS pass gate (PG$_L$ 331, PG$_R$, 341 FIG. 3). The benefit is that a pMOS pass gate in a complementary transmission gate is able to pullup and actively keep a logic '1' at the bit line BL, while an nMOS pass gate is not able to pull up or actively keep a logic '1' at the bit line BL, as its effective gate-to-source voltage Vgs will be in subthreshold. In a 6T SRAM cell, the bit line BL at a logic '1' may discharge due to leakage through other (inactive) cells attached to the bit line BL.

Figure 4:
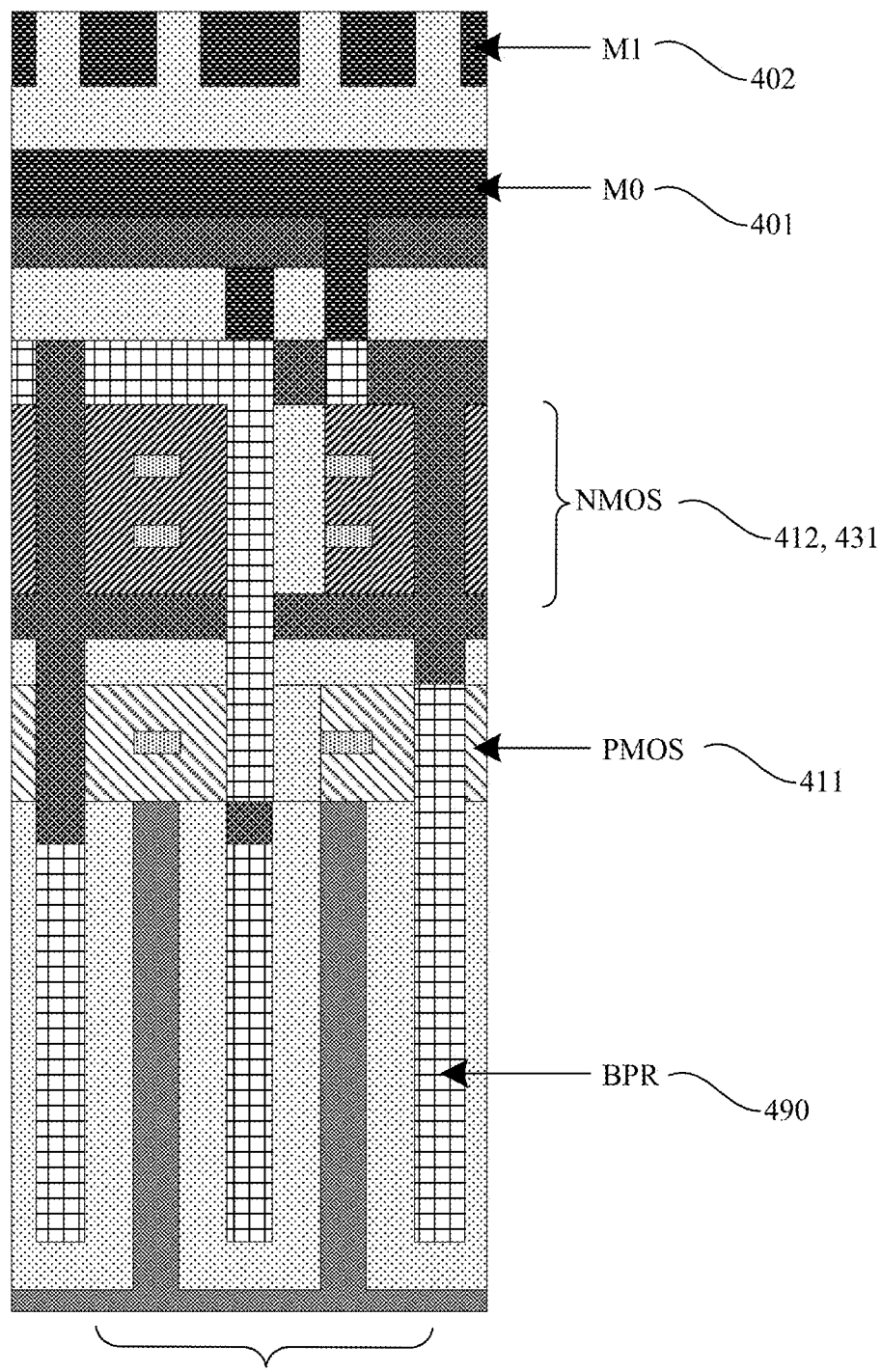
FIG. 4 illustrates a vertical cross section of the structure of a CFET cell shown in FIG. 2.

FIG. 4 illustrates a vertical cross section of the structure of a CFET cell such as shown in FIG. 2. The vertical cross section is in an X-Z plane taken along the line A-A' as shown in FIG. 2.

FIG. 4 illustrates a first metal level M0 401 where a first word line WL is disposed, a second metal level M1 402 where a power line VSS and complementary bit lines BL and BLB are disposed. Below the first metal level M0, NMOS transistors 412, 431 are disposed that can correspond to an nMOS transistor PD 212, 231 on a first side of the structure as shown in FIG. 2, and an nMOS transistor PG on a second side of the structure opposite the first side. Below the NMOS transistors, a PMOS transistor 411 is disposed that can correspond to PU 211 in FIG. 2.

Below the PMOS transistor, three vertical Buried Power Rails (BPRs) 490 are disposed, at no extra area cost to the structure shown in FIG. 2. For example, the materials of the BPRs can be Molybdenum (Mo) or Ruthenium (Ru). One of the three BPRs 490 can be used to write the second word line WWL, for connection to a first pMOS pass gate $CPG_L$ 332 and a second pMOS pass gate $CPG_R$ 342, in a first complementary transmission gate 330 and a second complementary transmission gate 340, respectively as shown in FIG. 3.

The two unused pMOS devices shown in FIG. 2 can be used as a first pMOS pass gate $CPG_L$ 332 and a second pMOS pass gate $CPG_R$ 342, at no extra area cost to the structure shown in FIG. 2.

Figure 5:
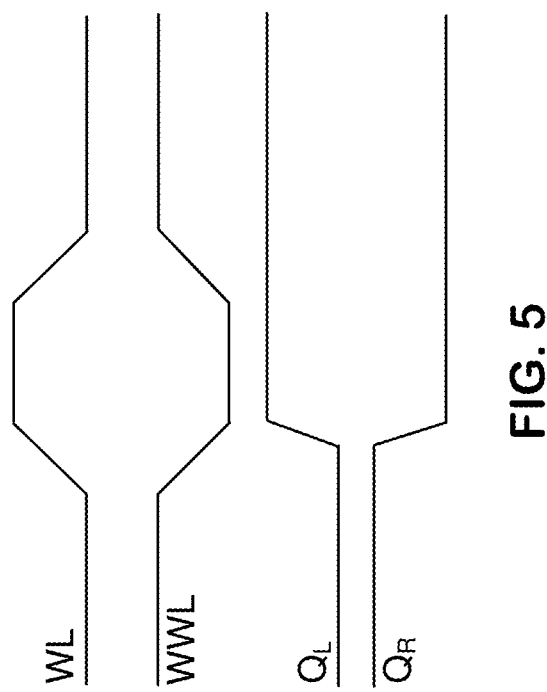
FIG. 5 is a waveform diagram showing an example write operation using an 8T SRAM cell as described herein.

FIG. 5 is a waveform diagram showing an example write operation using an 8T SRAM cell as described herein. A pMOS pass gate ($CPG_L$ 332, $CPG_R$ 342, FIG. 3) in a complementary transmission gate (330, 340, FIG. 3), controlled by the second word line WWL, can provide pulling-up of the '0' node ($Q_L$, $Q_R$) to '1', thus improving a write operation. In this example write operation, the first and second word lines WL and WWL can be triggered at the same time, or substantially contemporaneously. When a pass gate (e.g., 330) is stronger than a corresponding pull up transistor (e.g., 311), fewer or zero problems will be encountered raising the value to '1' using both nMOS and pMOS in the complementary transmission gate 330, 340 to overdrive the cell. Because of threshold voltage ($V_T$), nMOS is not good at pulling the zero node up to a one, as its final voltage will be ~1–[$V_T$]. Implementations of an 8T SRAM cell can enable both sides (e.g., 310, 320) of the cell (e.g., 300) to be written at the same time. Thus, in some implementations, both sides of the cell 300 contribute to a write operation. In a 6T cell implementation 100 by contrast, one side, i.e., the side that is being pulled down, is effective in the write operation. In the 8T cell implementation of FIG. 3, a set of complementary transmission gates 330, 340, comprising both nMOS transistors 331, 341 and pMOS transistors 332, 342 allows both sides (e.g., 310, 320) of cell 300 to contribute to the write operation, e.g., a '0' can be written on one node $Q_L$ and a '1' can be written on the other node $Q_R$.

Figure 6:
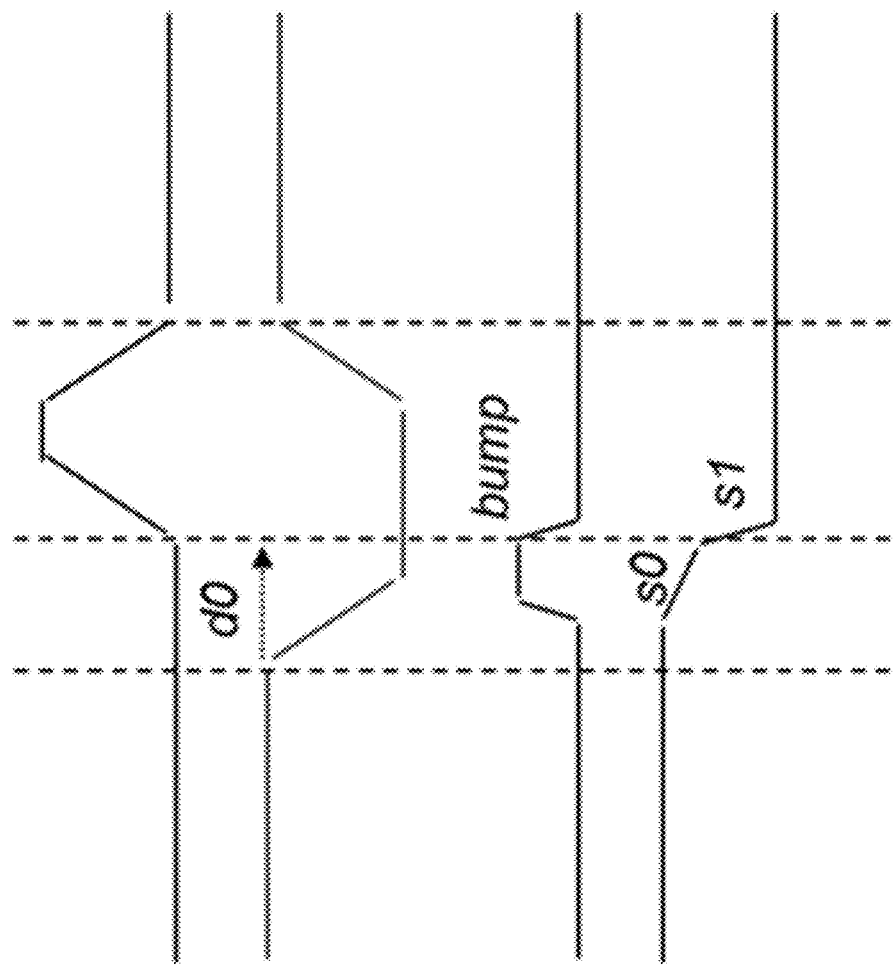
FIG. 6 is a waveform diagram showing an example read operation mode using an 8T SRAM cell as described herein.

FIG. 6 is a waveform diagram showing an example read operation mode using an 8T SRAM cell as described herein. This read operation mode includes:
1) Trigger the second word line WWL first on an 8T SRAM cell. This will cause a "bump" voltage at the first node ($Q_L$) of the cell when the first node is at a low voltage level ('0').
2) Wait until the "bump" voltage at the first node ($Q_L$) drops.
3) Trigger the first word line WL after the "bump" voltage drops during delay "d0". Here, "d0" is the selected delay between WL and WWL and represents a time period during which a read is performed from the weaker of the access transistors.

An 8T SRAM cell implementation provides improved stability during the slow "s0" discharge on the bit line BL during operation with only the WWL line active (i.e., a "weak read"), and when "s1" quick discharge is enabled by both WL and WWL lines activated (i.e., a "strong read"), the "bump" voltage should be lower, resulting in greater stability of the cell.

An "ultra-stable" 8T SRAM cell implementation can be realized, in which the first and second word lines WL and WWL can be synchronized for optimal read current. By initiating read of the weaker cell employing word line underdrive as a stability assist, WL is not swept up to Vdd, but rather goes to a point under Vdd, allowing the bump voltage to discharge, thereby suppressing an internal state of a '0' node. Thereafter, full strength of the WL can be triggered. In one implementation, the weaker bitcell is selected and then read circuitry waits for the bump voltage to discharge. The bump results from pre-charge on a bitline that is high. No current is flowing in one side of the cell, but on the other side of the cell, current flows in a path to ground through a PD transistor. As current dissipates, voltage will rise to that required to balance out these currents in the two sides of the bitcell. Noteworthy is that the greater the zero node bump voltage, the more likely the cell is to flip. Accordingly, in one implementation, drive circuitry starts to bring BL voltage down, then brings in the second WL later. For further description of word line underdrive, the skilled artisan may have reference to, "SRAM Assist Techniques for Operation in a Wide Voltage Range in 28-nm CMOS" IEEE Transactions On Circuits And Systems—II: Express Briefs, Vol. 59, No. 12, Dec. 2012 (//www1.icsi.berkeley.edu/pubs/arch/ICSI_sramassisttechniques12.pdf, last accessed Nov. 17, 2021).

Figure 7:
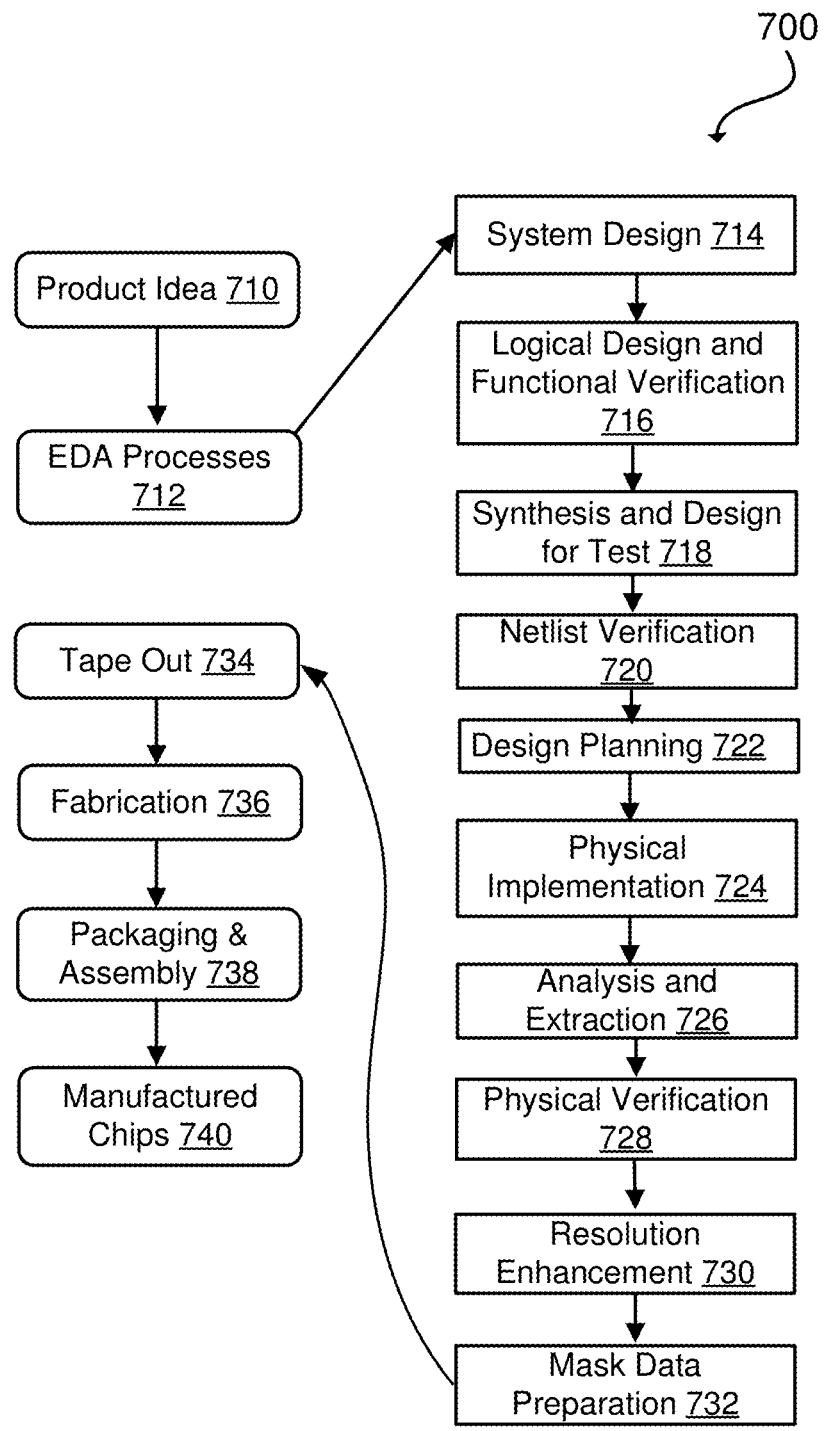
FIG. 7 depicts a flowchart of various processes used during the design and manufacture of an integrated circuit in accordance with some embodiments of the present technology.

FIG. 7 depicts a flowchart of various processes used during the design and manufacture of an integrated circuit in accordance with some embodiments of the present technology. FIG. 7 illustrates an example set of processes 700 used during the design, verification, and fabrication of an article of manufacture such as an integrated circuit (or an OTP bitcell, as described above) to transform and verify design data and instructions that represent the integrated circuit. Each of these processes can be structured and enabled as multiple modules or operations. The term 'EDA' signifies the term 'Electronic Design Automation.' These processes start with the creation of a product idea 710 with information supplied by a designer, information which is transformed to create an article of manufacture that uses a set of EDA processes 712. When the design is finalized, the design is taped-out 734, which is when artwork (e.g., geometric patterns) for the integrated circuit is sent to a fabrication facility to manufacture the mask set, which is then used to manufacture the integrated circuit. After tape-out, a semiconductor die is fabricated 736 and packaging and assembly processes 738 are performed to produce the finished integrated circuit 740.

Specifications for a circuit or electronic structure may range from low-level transistor material layouts to high-level description languages. A high-level of modelling may be used to design circuits and systems, using a hardware description language ('HDL') such as VHDL, Verilog, SystemVerilog, SystemC, MyHDL or OpenVera. The HDL description can be transformed to a logic-level register transfer level ('RTL') description, a gate-level description, a layout-level description, or a mask-level description. Each lower level of modelling adds more useful detail into the design description, for example, more details for the modules, including processors and executable code that include the description. The lower levels of the model can be generated by a computer, derived from a design library, or created by another design automation process. An example of a specification language at a lower level modelling or design language for specifying more detailed descriptions is SPICE, which is used for detailed descriptions of circuits with many analog components. Descriptions at each level of modelling are enabled for use by the corresponding tools of that layer (e.g., a formal verification tool). A design process may use a sequence depicted in FIG. 7. The processes described by be enabled by EDA products (or tools).

During system design 714, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 716, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 718, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 720, the netlist is checked for compliance with timing constraints and for correspondence with the HDL code. During design planning 722, an overall floor plan for the integrated circuit is constructed and analyzed for timing and top-level routing.

During layout or physical implementation 724, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 726, the circuit function is verified at the layout level, which permits refinement of the layout design. During physical verification 728, the layout design is checked to ensure that manufacturing constraints are correct, such as DRC constraints, electrical constraints, lithographic constraints, and that circuitry function matches the HDL design specification. During resolution enhancement 730, the geometry of the layout is transformed to improve how the circuit design is manufactured.

During tape-out, data is created to be used (after lithographic enhancements are applied if appropriate) for production of lithography masks. During mask data preparation 732, the 'tape-out' data is used to produce lithography masks that are used to produce finished integrated circuits.

A storage subsystem of a computer system (such as computer system 800 of FIG. 8) may be used to store the programs and data structures that are used by some or all of the EDA products described herein, and products used for development of cells for the library and for physical and logical design that use the library.

Figure 8:
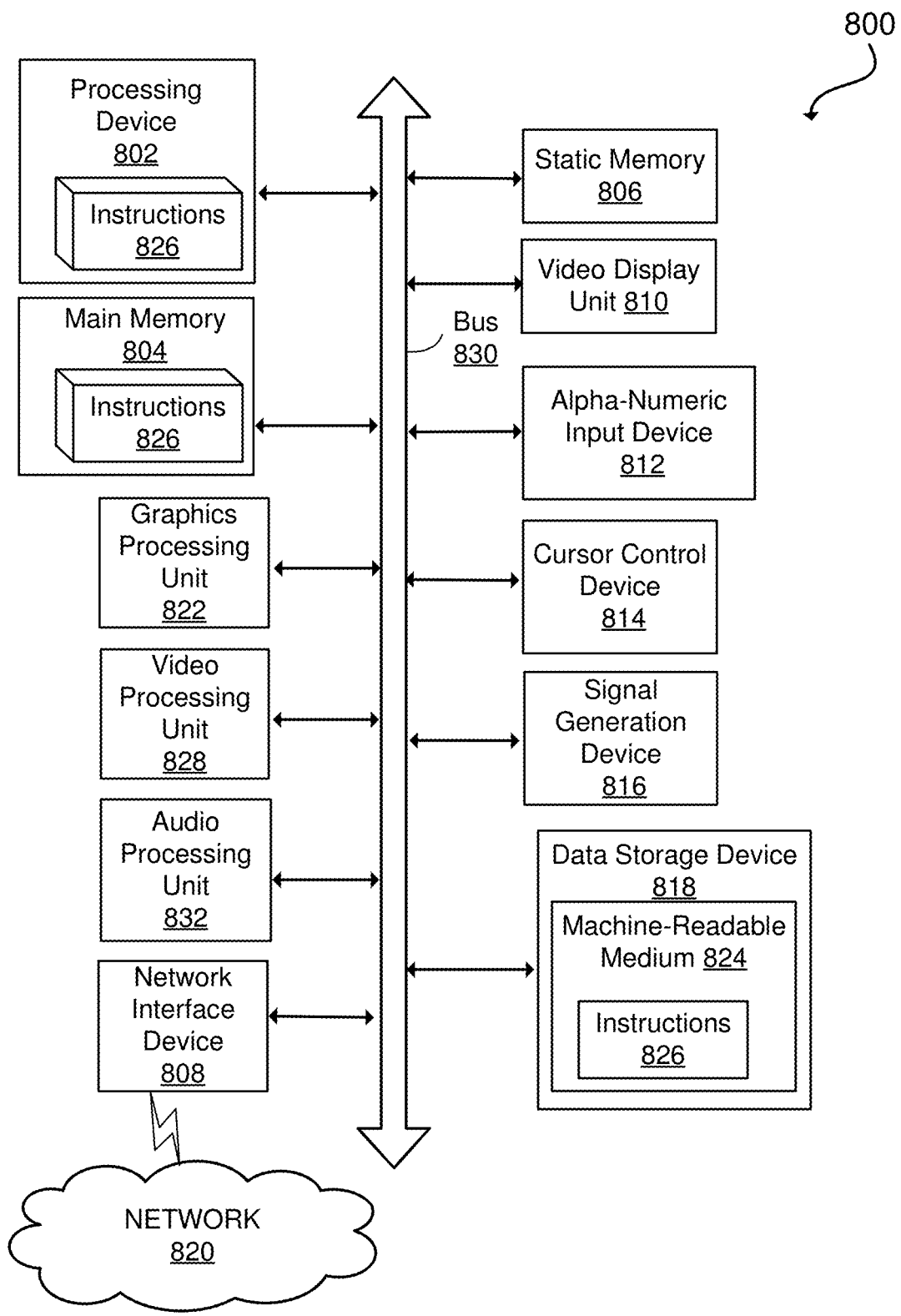
FIG. 8 depicts an architectural level diagram of an example computer system in which embodiments of the present technology may operate.

FIG. 8 depicts an architectural level diagram of an example computer system in which embodiments of the present technology may operate. FIG. 8 illustrates an example machine of a computer system 800 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 800 includes a processing device 802, a main memory 804 (e.g., read-only memory (ROM), flash memory, dynamic random access memory (DRAM) such as synchronous DRAM (SDRAM), a static memory 806 (e.g., flash memory, static random access memory (SRAM), etc.), and a data storage device 818, which communicate with each other via a bus 830.

Processing device 802 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 802 may also be one or more special-purpose processing devices such as an application specific integrated circuit (ASIC), a field programmable gate array (FPGA), a digital signal processor (DSP), network processor, or the like. The processing device 802 may be configured to execute instructions 826 for performing the operations and steps described herein.

The computer system 800 may further include a network interface device 808 to communicate over the network 820.

The computer system 800 also may include a video display unit 810 (e.g., a liquid crystal display (LCD) or a cathode ray tube (CRT)), an alphanumeric input device 812 (e.g., a keyboard), a cursor control device 814 (e.g., a mouse), a graphics processing unit 822, a signal generation device 816 (e.g., a speaker), graphics processing unit 822, video processing unit 828, and audio processing unit 832.

The data storage device 818 may include a machine-readable storage medium 824 (also known as a non-transitory computer-readable medium) on which is stored one or more sets of instructions 826 or software embodying any one or more of the methodologies or functions described herein. The instructions 826 may also reside, completely or at least partially, within the main memory 804 and/or within the processing device 802 during execution thereof by the computer system 800, the main memory 804 and the processing device 802 also constituting machine-readable storage media.

In some implementations, the instructions 826 include instructions to implement functionality corresponding to the present technology. While the machine-readable storage medium 824 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 802 to perform any one or more of the methodologies of the present technology. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present technology, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present technology also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present technology is not described with reference to any particular programming language. It will be appreciated that a variety of programming languages may be used to implement the teachings of the technology as described herein.

The present technology may be provided as a computer program product, or software, that may include a machine-readable medium having stored thereon instructions, which may be used to program a computer system (or other electronic devices) to perform a process according to the present technology. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing, implementations of the present technology have been described with reference to specific example implementations thereof. It will be evident that various modifications may be made thereto without departing from the broader spirit and scope of implementations of the disclosure as set forth in the following claims. Where the text refers to some elements in the singular tense, more than one element can be depicted in the figures and like elements are labeled with like numerals. The description and drawings are, accordingly, to be regarded in an illustrative sense rather than a restrictive sense.

What is claimed is:

1. A memory cell, comprising:
   a pair of cross-coupled inverters as a storage element, a first inverter in the pair of cross-coupled inverters having a first output at a first node, a second inverter in the pair of cross-coupled inverters having a second output at a second node;
   a first complementary transmission gate including a first nMOS pass gate and a first pMOS pass gate, connected between the first node and a first bit line;
   a second complementary transmission gate including a second nMOS pass gate and a second pMOS pass gate, connected between the second node and a second bit line;
   a first word line connected to gate conductors of the first and second nMOS pass gates in the first and second complementary transmission gates; and
   a second word line connected to gate conductors of the first and second pMOS pass gates in the first and second complementary transmission gates,
   wherein a signal drop is triggered on the second word line to generate a first voltage drop on the first bit line,
   wherein, after the signal drop is triggered on the second word line, a bump voltage is generated at the first node and then the bump voltage drops, and wherein a signal rise is triggered on the first word line, after the bump voltage drops, to generate a second voltage drop on the first bit line.

2. The memory cell of claim 1, wherein the pair of cross-coupled inverters, the first complementary transmission gate, and the second complementary transmission gate are implemented within a single CFET cell.

3. The memory cell of claim 2, wherein the CFET cell comprises a multilayer stacked structure, including:
   a first metal layer, in which the first word line is disposed,
   a first transistor layer,
   a second transistor layer, and
   a second metal layer, in which the second word line is disposed.

4. The memory cell of claim 3, wherein the first transistor layer includes:
   the first nMOS pass gate of the first complementary transmission gate,
   the second nMOS pass gate of the second complementary transmission gate,
   a first nMOS pull down transistor of a first one of the pair of cross-coupled inverters, and
   a second nMOS pull down transistor of a second one of the pair of cross-coupled inverters.

5. The memory cell of claim 3, wherein the first pMOS pass gate is disposed in the second transistor layer beneath the first nMOS pass gate disposed in the first transistor layer, and the second pMOS pass gate is disposed in the second transistor layer beneath the second nMOS pass gate disposed in the first transistor layer.

6. The memory cell of claim 3, wherein the CFET cell further comprises:
   a third metal layer, in which a set of complementary bit lines, and a power line VSS are disposed.

7. The memory cell of claim 3, further comprising a buried power rail (BPR) used to write to a second word line.

8. A method for reading a memory cell, the memory cell comprising,
   a pair of cross-coupled inverters as a storage element, a first inverter in the pair of cross-coupled inverters having a first output at a first node, a second inverter in the pair of cross-coupled inverters having a second output at a second node;
   a first complementary transmission gate including a first nMOS pass gate and a first pMOS pass gate, connected between the first node and a first bit line;
   a second complementary transmission gate including a second nMOS pass gate and a second pMOS pass gate, connected between the second node and a second bit line;
   a first word line connected to gate conductors of the first and second nMOS pass gates in the first and second complementary transmission gates; and
   a second word line connected to gate conductors of the first and second pMOS pass gates in the first and second complementary transmission gates,
   the method comprising:
      first triggering a signal drop on the second word line to generate a first voltage drop on the first bit line;
      after the first triggering, waiting until a bump voltage at the first node drops; and
      triggering a signal rise on the first word line after the bump voltage at the first node drops, to generate a second voltage drop on the first bit line.

9. The method of claim 8, further including: synchronizing the first and second word lines to achieve a preferred read current, by initiating read of a weaker cell employing word line underdrive as a stability assist, whereby the first and second word lines are swept up to an operating voltage less than Vdd, allowing the bump voltage to discharge.

* * * * *